United States Patent
Johnson et al.

(10) Patent No.: US 7,558,546 B2
(45) Date of Patent: Jul. 7, 2009

(54) SELECTABLE HIGH-SIDE/LOW-SIDE MIX FOR HIGH INTERMEDIATE FREQUENCY (IF) RECEIVERS

(75) Inventors: Richard A. Johnson, Buda, TX (US); James M. Nohrden, Lakeway, TX (US); Li Gao, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 391 days.

(21) Appl. No.: 11/239,991

(22) Filed: Sep. 30, 2005

(65) Prior Publication Data

US 2006/0073800 A1 Apr. 6, 2006

Related U.S. Application Data

(63) Continuation-in-part of application No. 10/377,753, filed on Feb. 28, 2003.

(51) Int. Cl.
    *H04B 1/18* (2006.01)
(52) U.S. Cl. ............... 455/182.3; 455/192.1; 455/302; 455/303; 455/296; 455/232.1
(58) Field of Classification Search ............ 455/182.3, 455/192.1, 302, 303, 296, 232.1, 232; 375/375, 375/376
See application file for complete search history.

(56) References Cited

U.S. PATENT DOCUMENTS

| | | |
|---|---|---|
| 4,346,477 A | 8/1982 | Gordy |
| 4,361,906 A | 11/1982 | Sakamoto |
| 4,464,770 A | 8/1984 | Maurer et al. |
| 4,626,803 A | 12/1986 | Holm |
| 4,653,117 A | 3/1987 | Heck |
| 4,803,700 A | 2/1989 | Dewey et al. |
| 4,817,167 A | 3/1989 | Gassmann |

(Continued)

FOREIGN PATENT DOCUMENTS

WO    WO 87/01531    3/1987

(Continued)

OTHER PUBLICATIONS

"A GSM/GPRS Mixed Signal Baseband IC," Redmond, David. et al., IEEE Int'l. Solid State Circuits Conference (ISSCC), Digest of Technical Papers, XP010585465, Feb. 2002, Sec. 3.6.

(Continued)

*Primary Examiner*—Sanh D Phu
(74) *Attorney, Agent, or Firm*—Larson Newman Abel & Polansky, LLP

(57) ABSTRACT

A method in which one of a high-side mix mode and a low-side mix mode is selected in response to an interference characteristic of a desired channel of a radio frequency (RF) input signal is disclosed. In the high-side mix mode, a direct digital frequency synthesizer (130) is initialized to output a digital local oscillator signal at a first frequency suitable for performing a high-side mix of the desired channel to an intermediate frequency (IF). In the low-side mix mode, the direct digital frequency synthesizer (130) is initialized to output the digital local oscillator signal at a second frequency suitable for performing a low-side mix of the desired channel to said IF. The RF input signal is mixed with the digital local oscillator signal to provide an IF output signal at the IF.

20 Claims, 7 Drawing Sheets

U.S. PATENT DOCUMENTS

| | | | |
|---|---|---|---|
| 4,866,261 A | 9/1989 | Pace | |
| 4,926,130 A | 5/1990 | Weaver | |
| 4,944,025 A | 7/1990 | Gehring et al. | |
| 4,975,699 A | 12/1990 | Frey | |
| 5,251,218 A | 10/1993 | Stone et al. | |
| 5,263,194 A | 11/1993 | Ragan | |
| 5,331,293 A | 7/1994 | Shepherd et al. | |
| 5,425,057 A | 6/1995 | Paff | |
| 5,428,824 A * | 6/1995 | Kasai | 455/78 |
| 5,440,587 A | 8/1995 | Ishikawa et al. | |
| 5,442,352 A | 8/1995 | Jackson | |
| 5,495,512 A | 2/1996 | Kovacs et al. | |
| 5,544,200 A | 8/1996 | An | |
| 5,598,430 A * | 1/1997 | Hachisuka et al. | 375/216 |
| 5,640,698 A | 6/1997 | Shen et al. | |
| 5,701,598 A | 12/1997 | Atkinson | |
| 5,708,687 A * | 1/1998 | Powell et al. | 375/376 |
| 5,737,035 A | 4/1998 | Rotzoll | |
| 5,752,174 A | 5/1998 | Matai et al. | |
| 5,826,180 A | 10/1998 | Golan | |
| 5,828,955 A | 10/1998 | Lipowski et al. | |
| 5,867,535 A | 2/1999 | Phillips et al. | |
| 6,002,924 A * | 12/1999 | Takano | 455/161.1 |
| 6,121,819 A | 9/2000 | Traylor | |
| 6,154,640 A | 11/2000 | Itoh et al. | |
| 6,172,569 B1 | 1/2001 | McCall et al. | |
| 6,177,964 B1 | 1/2001 | Birleson et al. | |
| 6,222,891 B1 | 4/2001 | Liu et al. | |
| 6,249,179 B1 | 6/2001 | Maalej et al. | |
| 6,278,391 B1 | 8/2001 | Walker | |
| 6,321,075 B1 | 11/2001 | Butterfield | |
| 6,330,290 B1 | 12/2001 | Glas | |
| 6,377,315 B1 | 4/2002 | Carr et al. | |
| 6,504,498 B1 | 1/2003 | O'Brien | |
| 6,567,654 B1 | 5/2003 | Coronel Arredondo et al. | |
| 6,593,805 B2 | 7/2003 | Kunieda et al. | |
| 6,600,373 B1 | 7/2003 | Bailey et al. | |
| 6,639,534 B2 | 10/2003 | Khoini-Poorfard et al. | |
| 6,650,624 B1 | 11/2003 | Quigley et al. | |
| 6,694,131 B1 * | 2/2004 | Lakkis | 455/302 |
| 6,711,149 B1 | 3/2004 | Yano et al. | |
| 6,727,936 B2 | 4/2004 | Liu et al. | |
| 6,778,117 B1 | 8/2004 | Johnson | |
| 6,785,345 B2 | 8/2004 | Blazo | |
| 6,785,529 B2 | 8/2004 | Ciccarelli et al. | |
| 6,799,020 B1 | 9/2004 | Heidmann et al. | |
| 6,829,311 B1 | 12/2004 | Riley | |
| 6,867,693 B1 | 3/2005 | Radin | |
| 6,876,839 B2 | 4/2005 | Harris | |
| 6,950,047 B1 | 9/2005 | Piasecki et al. | |
| 6,961,314 B1 | 11/2005 | Quigley et al. | |
| 6,963,734 B2 | 11/2005 | Sorrells et al. | |
| 6,965,616 B1 | 11/2005 | Quigley et al. | |
| 7,023,868 B2 | 4/2006 | Rabenko et al. | |
| 7,027,528 B2 | 4/2006 | Liu et al. | |
| 7,035,595 B1 | 4/2006 | Kim et al. | |
| 7,079,195 B1 | 7/2006 | Birleson et al. | |
| 7,103,065 B1 | 9/2006 | Quigley et al. | |
| 7,124,153 B2 | 10/2006 | Grushin | |
| 7,139,329 B2 | 11/2006 | Takahiko | |
| 7,183,958 B2 | 2/2007 | Quilligan et al. | |
| 7,199,740 B1 | 4/2007 | Ferguson et al. | |
| 7,227,438 B2 | 6/2007 | Song et al. | |
| 7,236,212 B2 | 6/2007 | Carr et al. | |
| 7,239,357 B2 | 7/2007 | Jaffe | |
| 7,254,190 B2 | 8/2007 | Kwentus et al. | |
| 2001/0041532 A1 | 11/2001 | Tomasz et al. | |
| 2002/0168951 A1 | 11/2002 | Paulus et al. | |
| 2002/0177423 A1 | 11/2002 | Cowley | |
| 2003/0007377 A1 | 1/2003 | Otaka | |
| 2003/0083033 A1 | 5/2003 | Staszewski et al. | |
| 2003/0112893 A1 | 6/2003 | Lee et al. | |
| 2003/0199264 A1 | 10/2003 | Holenstein et al. | |
| 2003/0223525 A1 | 12/2003 | Momtaz et al. | |
| 2004/0002318 A1 | 1/2004 | Kerth et al. | |
| 2005/0142040 A1 * | 6/2005 | Hanawa et al. | 422/102 |
| 2005/0239499 A1 | 10/2005 | Oosawa et al. | |
| 2006/0083320 A1 | 4/2006 | Feher | |
| 2006/0141973 A1 | 6/2006 | Behrens et al. | |
| 2007/0085719 A1 | 4/2007 | Maxim et al. | |

OTHER PUBLICATIONS

"Optimized Digital Signal Processing for Flexible Receivers," Brückmann, Dieter et al., IEEE Int'l (ICASSP), XP010804418, 2002, pp. IV—3765-3766.

Sony Product Listing, "CXA3250AN: All Band TV Tuner IC with On-Chip PLL"Datasheet.

Kim et al., A Low Power CMOS Bluetooth Transceiver With A Digital Offset Cancelling DLL-Based GFSK Demodulator, Feb. 9-13, 2003, Proceedings of IEEEE Int'l Solid State Circuits Conference, IEEE, vol. 1, pp. 96-481.

Kim et al., "A Single Chip Quad-Band GSM/GPRS Transceiver in. 18um Standard CMOS," 2005 IEEE Int'l Solid State Circuit Conference, vol. 1, pp. 318-601.

* cited by examiner

SELECTABLE HIGH-SIDE/LOW-SIDE MIX FOR HIGH INTERMEDIATE FREQUENCY (IF) RECEIVERS

This application is a continuation-in-part of prior U.S. patent application Ser. No. 10/377,573, entitled "Tuner Suitable for Integration and Method for Tuning a Radio Frequency Signal," invented by Richard A. Johnson, filed on Feb. 28, 2003, and assigned to the assignee hereof.

CROSS REFERENCE TO RELATED, COPENDING APPLICATION

Related subject matter is found in a copending patent application entitled "Television Receiver with Automatic Gain Control," application Ser. No. 11/093,547, invented by Andrew W. Dombusch, Li Gao, and James M. Nohrden, filed on Mar. 30, 2005, and assigned to the assignee hereof.

TECHNICAL FIELD

The present invention relates generally to radio frequency (RF) receivers, and more particularly to RF receivers capable of providing high intermediate frequency (IF) outputs.

BACKGROUND

The majority of television tuners used today are discrete single conversion tuners. FIG. 1 illustrates in partial block diagram and partial schematic form such a discrete single conversion television tuner 20 known in the prior art. Television tuner 20 has an input for receiving a radio frequency (RF) signal labeled "RF INPUT" from an antenna or cable source (not shown) having channels in the range of 48 megahertz (MHz) to 870 MHz. A tracking bandpass filter 22 receives the RF INPUT signal and attenuates undesired channel energy to provide a filtered signal to an input of a low noise amplifier labeled "LNA" 24. An RF synthesizer 28 controls a variable local oscillator (LO) 30 to provide a mixing signal in the range of 95 to 911 MHz. The mixing signal is combined with the output of LNA 24 in a mixer 26, which mixes the desired channel to an intermediate frequency (IF) of 44 MHz. The output of mixer 26 is amplified in a programmable gain amplifier (PGA) 32 and is filtered in an IF filter 34 having a center frequency at the conventional IF of 44 MHz and having a passband of 6 MHz. Thus IF filter 34 provides an output signal containing the desired channel and having frequency content primarily from 41 MHz to 47 MHz.

Discrete single conversion tuners such as tuner 20 suffer several disadvantages. Tuner 20 requires a large amount of circuit board space due to the large number of discrete components. It also requires RF expertise to lay out the circuit board to avoid undesirable signal cross coupling and interference. Tracking bandpass filter 22 needs manual calibration, increasing production cost. Also the performance of tuner 20 varies significantly over temperature.

It has long been thought that a silicon-based television tuner could be manufactured cheaper and with more stable performance than a discrete tuner and that silicon-based television tuners would ultimately replace discrete television tuners. Unfortunately, existing silicon-based television tuners do not perform as well as discrete tuners and have not become significant in the marketplace.

FIG. 2 illustrates one known existing silicon-based television tuner 40. Tuner 40 uses a so-called "up/down" or double conversion architecture. Tuner 40 includes an LNA 42, an up conversion mixer 44, an RF synthesizer 46, a local oscillator 48, a surface acoustic wave (SAW) filter 50, a PGA 52, a down conversion mixer 54, a local oscillator 56, and an IF filter 58. LNA 42 has an input for receiving the RF INPUT signal from an antenna or cable source (not shown), and an output. Up conversion mixer 44 has a first input connected to the output of LNA 42, a second input for receiving a signal labeled "LO1", and an output. RF synthesizer 46 has first and second outputs for respectively providing first and second control signals. Oscillator 48 has an input connected to the first output of RF synthesizer 46, and an output for providing signal LO1. SAW filter 50 has an input connected to the output of mixer 44, and an output. PGA 52 has an input connected to the output of SAW filter 50, and an output. Mixer 54 has a first input connected to the output of PGA 52, a second input for receiving a signal labeled "LO2", and an output. Oscillator 56 has an input connected to the second output of RF synthesizer 46, and an output connected to the second input of mixer 54. IF filter 58 has an input connected to the output of mixer 54, and an output for providing the IF OUTPUT signal with similar spectral characteristics as the output of tuner 20.

LNA 42 functions as a broadband amplifier and provides an amplified signal to mixer 44. Mixer 44 receives mixing signal LO1 from oscillator 48 at a frequency chosen to mix the selected channel to a frequency band centered around 1100 MHz, but mixes undesired channels as well. SAW filter 50 is an external filter that separates the desired channel, centered around 1100 MHz, from the unwanted channels. PGA 52 amplifies the output of SAW filter 50 to provide an output signal having uniform signal strength. Mixer 54 mixes the output of PGA 52 down to the desired IF frequency of 44 MHz using mixing signal LO2 at 1056 MHz provided by oscillator 56. IF filter 58 has a center frequency of 44 MHz and a passband of 6 MHz and attenuates unwanted channel information outside of this range.

While the up/down architecture of tuner 40 does not require manual calibration during manufacturing and is stable over temperature, it has many deficiencies that make its performance inferior to the discrete tuner illustrated in FIG. 1. Tuner 40 uses two high frequency oscillators. Because they are high frequency it is possible to implement them in silicon using inductor-capacitor (LC) oscillators. However LC-based oscillators have many drawbacks that reduce their desirability. First, they are susceptible to electric and magnetic interference which can create spurs (or tones) and noise and lower overall performance. Second, two oscillators which are close in frequency such as oscillators 48 and 56 used in tuner 40 tend to lock to one another. To avoid locking, there needs to be a lot of isolation between the two oscillators, which is difficult to achieve. Third, the first oscillator's range is nearly 100% of its frequency which means that the LC product must vary by about a 4:1 ratio to successfully tune over this range (since frequency is proportional to the square root of one over the LC product). However this range of values is difficult to achieve in silicon. Such an oscillator would usually be implemented as many selectable LC oscillators but this approach requires a lot of integrated circuit area. Fourth, having multiple LC oscillators adds phase noise which can degrade performance for digital television applications.

Another disadvantage relates to external SAW filter 50. SAW filter 50 is required because undesired channels need to be attenuated by a large amount and only SAW filters have the desired transfer characteristic at such high frequencies. However SAW filters are expensive. They need to be driven with a matched impedance, which increases power dissipation substantially. SAW filters are lossy. Also while SAW filters have good attenuation they have poor frequency selectivity and pass more than just the desired channel.

Another disadvantage relates to the mixing process in different signal environments. Cable television tuning requirements are very different from terrestrial television tuning requirements because of the difference in energy levels between a desired channel and undesired channels at adjacent frequencies. A cable head-end drives all channels with similar power levels and therefore a cable television tuner receives the desired and undesired channels at similar power levels. A terrestrial television receiver could be much closer to undesired channels' transmitters than to the desired channel's transmitter, leading to the undesired channels having much more signal energy than the desired channel. The tracking filter of tuner 20 helps filter the undesired channels. However since there is no tracking filter in tuner 40 and since SAW filter 50 passes more than the desired channel, mixers 44 and 54 see the large energy difference between the desired and the undesired channel.

This energy difference is very problematic since any spur or noise in the oscillator or non-linearity in the mixing process can mix the large undesired channel or channels into the desired channel and destroy the reception of the desired channel. The result is that tuner 40 has sufficient performance for some cable television applications, in which signal strength of all channels is nearly uniform, but poor performance as a terrestrial television tuner. Thus tuner 40 has failed to displace discrete tuner 20.

Thus it would be desirable to have a tuner architecture that is suitable for integration but which has performance comparable to or better than that of a discrete tuner.

Moreover certain transmission systems, such as broadcast television, frequently use direct conversion tuners with a high IF. A high IF has a frequency close to the desired frequency spectrum. North American broadcast television uses an IF of 44 MHz while the lowest channel is at 54 MHz, and thus they can be classified as high IF systems.

Traditionally broadcast television tuners do not use both high-side mixing and low-side mixing because they include tracking filters for image rejection. To keep the cost and complexity down of the tracking filters, only one type (high-side or low-side) of mixing is used. For various unrelated reasons, broadcast television tuners have standardized on high-side mixing. However, if image rejection is implemented without tracking filters, then both high-side and low-side mixing are possible without significantly increasing the cost or complexity of the tuner. High side mixers use an LO signal at the frequency of the desired channel plus the IF frequency. Using high side mixing reduces the oscillator frequency range compared to low side mixing, so that the LO can be practically implemented easily using conventional LC tank oscillators. In the case of North American broadcast television, the high side mixing signal used for terrestrial television varies from 98 MHz (44 MHz+54 MHz) to 850 MHz (806 MHz+44 MHz), and the tuning range from the minimum frequency to the maximum frequency is 850 MHz/98 MHz=8.7. If low side mixing were used, the LO signal would have to vary from 10 MHz (54 MHZ−44 MHz) to 762 MHz (806 MHz−44 MHz) and the tuning range from the minimum frequency to the maximum frequency would be 762 MHz/10 MHz=76.2. This tuning range is too large to be practically implemented using conventional LC tank oscillators, whose frequency of oscillation is determined by $$\frac{1}{2\pi\sqrt{LC}}.$$

Thus a tuning range of 76 would require a variation in L or C of $(76)^2=5776$.

However terrestrial television is characterized by a sparsely populated spectrum (e.g., less than 30 channels) in a wide bandwidth (54 MHz to 806 MHz in the U.S.). Due to the variable distance of each television receiver from the various transmitters, interfering channels vary in strength for each receiver. Also because different locations have different frequency allocations, interfering channels are at different frequencies for each television receiver. Thus some channels referred to as "blockers" create image frequencies that get mixed to the selected IF and are particularly troublesome because their signal energy can be much higher than that of the desired channel. For these blockers it would be desirable to use low side mixing, but low side mixing for high IF systems cannot be practically achieved using known LC tank oscillators and architectures having tuners with tracking filters.

BRIEF SUMMARY

In one form a method in which one of a high-side mix mode and a low-side mix mode is selected in response to an interference characteristic of a desired channel of a radio frequency (RF) input signal is disclosed. In the high-side mix mode, a direct digital frequency synthesizer is initialized to output a digital local oscillator signal at a first frequency suitable for performing a high-side mix of the desired channel to an intermediate frequency (IF). In the low-side mix mode, the direct digital frequency synthesizer is initialized to output the digital local oscillator signal at a second frequency suitable for performing a low-side mix of the desired channel to the IF. The RF input signal is mixed with the digital local oscillator signal to provide an IF output signal at the IF.

In another form, a receiver includes a direct digital frequency synthesizer, a mixer, and a determination circuit. The direct digital frequency synthesizer has an output for providing a digital local oscillator signal at a frequency that mixes a desired channel to a high intermediate frequency (IF). The mixer has a first input for receiving a radio frequency (RF) input signal, a second input coupled to the output of the direct digital frequency synthesizer, and an output for providing an IF output signal at the high IF. The determination circuit has an output coupled to the direct digital frequency synthesizer for causing the direct digital frequency synthesizer to output the digital local oscillator signal at a frequency suitable for performing a selected one of a high-side mix and a low-side mix in response to both the desired channel and an interference characteristic of the desired channel.

In yet another form, an integrated circuit tuner includes a direct digital frequency synthesizer, a mixer, a power detector, and a local oscillator frequency register. The direct digital frequency synthesizer has an input for receiving a local oscillator frequency value, and an output for providing a digital local oscillator signal at a frequency corresponding to the local oscillator frequency value. The mixer has a first input for receiving a radio frequency (RF) input signal, a second input coupled to the output of the direct digital frequency synthesizer, and an output for providing an intermediate frequency (IF) output signal at a high IF. The power detector has an input coupled to the output of the mixer, and an output adapted to be coupled to a logic circuit. The local oscillator frequency register has an input adapted to be coupled to the logic circuit, and an output coupled the input of the direct digital frequency synthesizer for receiving and storing the local oscillator frequency value from the logic circuit, the logic circuit using the output of the power detector to provide the local oscillator frequency value to cause the mixer to mix a desired channel of the RF input signal to a high IF using a selected one of a high-side mix and a low-side mix.

BRIEF DESCRIPTION OF THE DRAWINGS

The present invention will hereinafter be described in conjunction with the following drawing figures, wherein like numerals denote like elements, and.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 3:
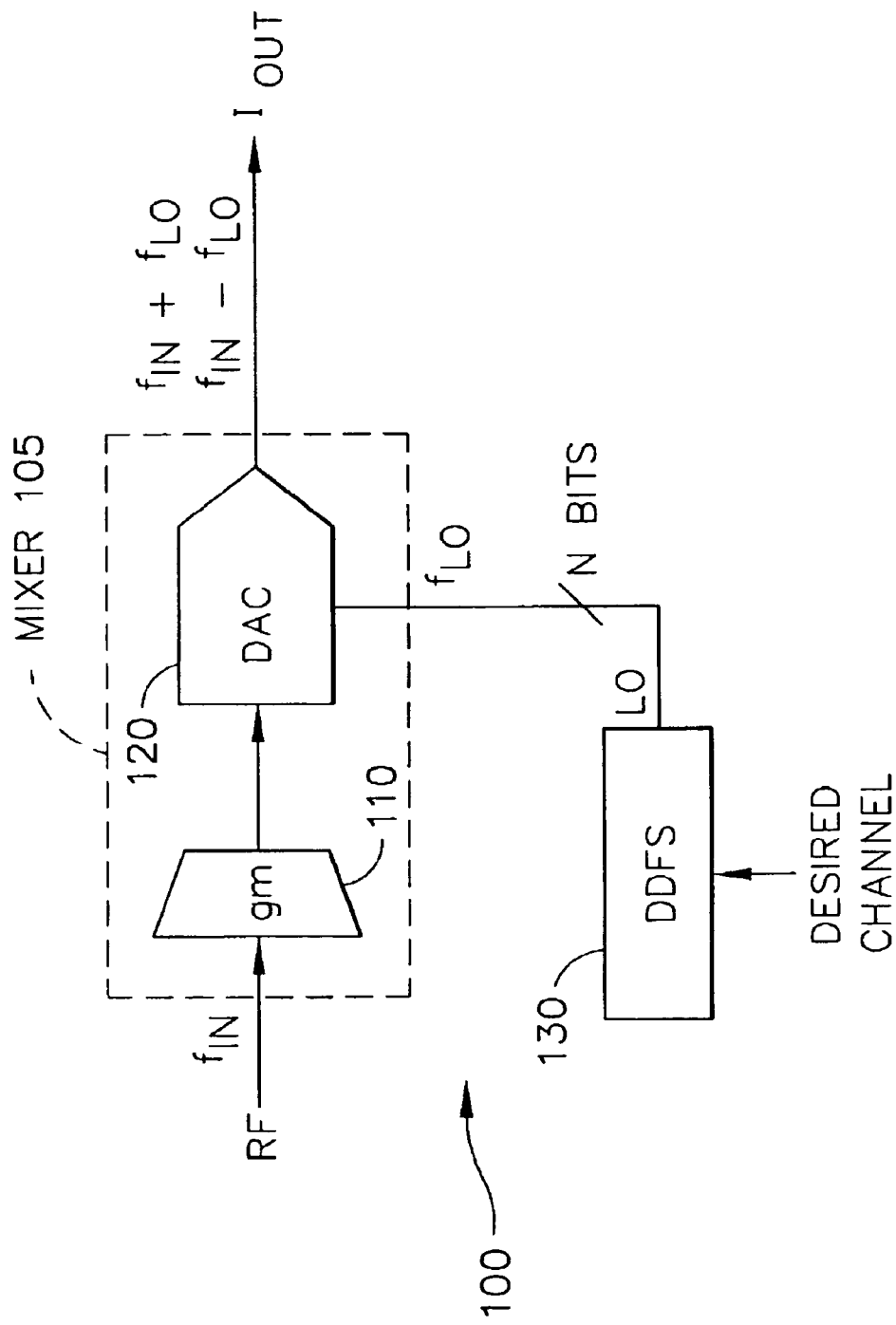
FIG. 3 illustrates in partial block diagram and partial schematic form a local oscillator and mixer circuit useful in a television tuner according to the present invention.

FIG. 3 illustrates in partial block diagram and partial schematic form a local oscillator and mixer circuit 100 useful in a television tuner according to the present invention. Circuit 100 includes a transconductance amplifier 110, a current multiplying DAC 120, and a DDFS 130. Transconductance amplifier 110 has an input terminal for receiving a radio frequency signal labeled "RF", and an output terminal for providing a current signal, and has an associated transconductance labeled "gm". As used herein, "radio frequency signal" means an electrical signal conveying useful information and having a frequency from about 3 kilohertz (kHz) to thousands of gigahertz (GHz), regardless of the medium through which such signal is conveyed. Thus an RF signal may be transmitted through air, free space, coaxial cable, fiber optic cable, etc. Signal RF has desired spectral content centered at a frequency $f_{IN}$. Current multiplying DAC 120 has a first input terminal connected to the output terminal of transconductance amplifier 110, a second input terminal, and an output terminal for providing an output signal labeled "$I_{OUT}$". DDFS 130 has an input terminal for receiving a tuning signal corresponding to a DESIRED CHANNEL, and an output terminal connected to the second input terminal of current multiplying DAC 120 for providing a digital local oscillator signal labeled "LO" represented by N bits. LO is a digital representation of voltages of a sine wave having a frequency $f_{LO}$.

In basic operation, transconductance amplifier 110 converts the RF signal from a voltage signal into a current signal. DAC 120 is a current multiplying DAC that receives the current signal at the output of transconductance amplifier 110, mixes it bit-by-bit with the N-bit mixing signal from DDFS 130, and sums the output current components to form $I_{OUT}$. As a result of the mixing operation $I_{OUT}$ moves the spectral content of RF to sum and difference frequencies, namely $f_{IN}+f_{LO}$ and $f_{IN}-f_{LO}$. DDFS 130 provides signal LO at a frequency chosen to mix the DESIRED CHANNEL to another frequency of interest, such as baseband or a suitable intermediate frequency (IF). Current multiplying DAC 120 includes multiple mixing cells each weighted according to the order of the cell.

Figure 4:
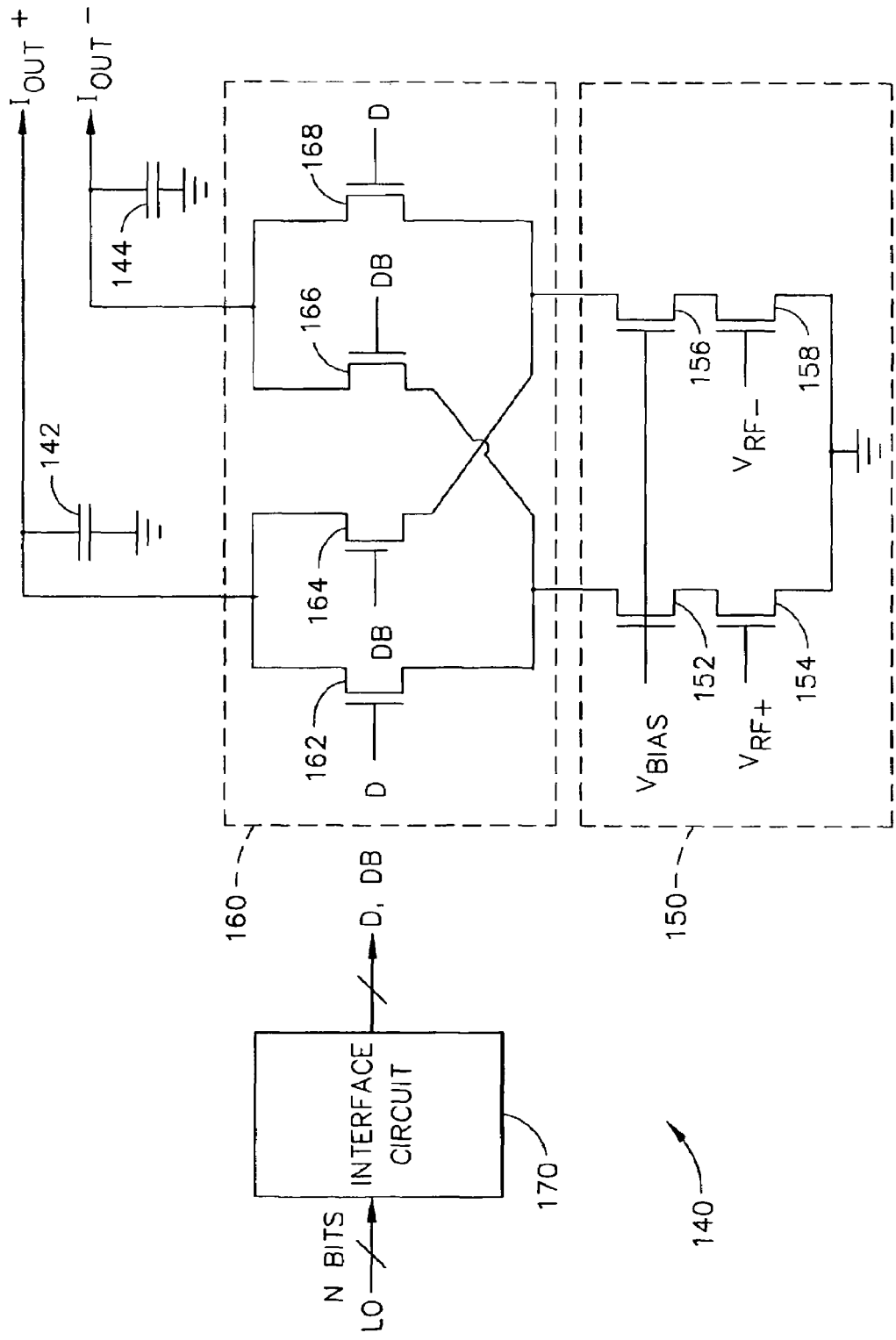
FIG. 4 illustrates in schematic form a circuit implementation of one cell of the mixer circuit of FIG. 3.

FIG. 4 illustrates in schematic form a circuit implementation of one cell 140 of mixer circuit 105 of FIG. 3. Cell 140 includes generally a current cell 150 of transconductance amplifier 110 and a converter cell 160 of DAC 120. Also shown in FIG. 3 are an interface circuit 170 of DAC 120, a load capacitor 142, and a load capacitor 144. Current cell 150 includes N-channel metal-oxide-semiconductor (MOS) transistors 152, 154, 156, and 158. Transistor 152 has a drain, a gate for receiving a bias voltage labeled "$V_{BIAS}$", and a source. Transistor 154 has a drain connected to the source of transistor 152, a gate for receiving a signal labeled "$V_{RF+}$", and a source connected to a ground power supply voltage terminal. Transistor 156 has a drain, a gate for receiving bias voltage $V_{BIAS}$, and a source. Transistor 158 has a drain connected to the source of transistor 156, a gate for receiving a signal labeled "$V_{RF-}$", and a source connected to the ground power supply voltage terminal.

Converter cell 160 includes transistors 162, 164, 166, and 168. Transistor 162 has a drain for providing signal $I_{OUT}^{+}$, a gate for receiving a true data signal labeled "D", and a source connected to the drain of transistor 132. Transistor 164 has a drain connected to the drain of transistor 162, a gate for receiving a complementary data signal labeled "DB", and a source connected to the drain of transistor 156. Transistor 166 has a drain for providing signal $I_{OUT-}$, a gate for receiving signal DB, and a source connected to the drain of transistor 152. Transistor 168 has a drain connected to the drain of transistor 166, a gate for receiving signal D, and a source connected to the drain of transistor 156.

Interface circuit 170 is shared between all current cells in DAC 120 and has an input terminal for receiving the N-bit LO signal from DDFS 130, and an output terminal for providing a multiple bit output signal labeled "D, DB". D and DB are true and complement digital signals, respectively, of a digital signal pair corresponding to certain values of the N-bit LO signal as will be described further below, and interface circuit provides one pair for each converter cell.

Capacitor 142 has a first terminal connected to the drains of transistors 162 and 164, and a second terminal connected to the ground power supply voltage terminal. Capacitor 144 has a first terminal connected to the drains of transistors 166 and 168, and a second terminal connected to the ground power supply voltage terminal. Capacitors 142 and 144 serve as filter capacitors and are shared between all cells.

The RF input signal is represented as a differential voltage signal between $V_{RF+}$ and $V_{RF-}$. $V_{BIAS}$ is a bias voltage selected to keep transistors 154 and 158 operating in the triode (linear) region of their voltage-current characteristic. Thus as $V_{RF+}$ and $V_{RF-}$ vary, they modulate the voltage at the sources of transistors 152 and 156, forming a differential current signal on the drains of transistors 132 and 136. The bits of the digital local oscillator signal LO cause transistors 162, 164, 166, and 168 to switch the current of current cell 150 from side to side. These currents are switched at the output speed of DDFS 130, $f_{CLOCK}$, which is constrained by Nyquist's theorem to be greater than twice the maximum $f_{LO}$.

The resolution (and hence the number of bits) required by DAC 120 can be determined by considering the worst-case energy in the undesired channels, since quantization noise will be mixed by the undesired channels into the desired band at the output of the mixer. A terrestrial television receiver may need to tune a relatively-weak desired channel when the receiver is close to the transmitter of a relatively-strong undesired channel. For example assume the desired channel has a signal strength of −83 dBm (where dBm represents a decibel power level with reference to a power level of 1 milliwatt dissipated across a 75 ohm load), an undesired channel has a signal strength of −15 dBm, and the minimum signal to noise ratio (SNR) required at the output of the mixer is 15 dB. The integrated quantization noise for the LO signal in a 6 MHz band for a 10-bit DAC clocked at 2 gigahertz (2 GHz) is −84 dBc (decibel level with respect to carrier frequency $f_{LO}$). This quantization noise appears in every 6 MHz band from DC to $f_{CLOCK}/2$ (1 GHz) and is mixed by the −15 dBm undesired channel into the desired channel's band at a −99 dBm level (−15 dBm+(−84 dBc)). The resulting SNR is thus −83 dBm−(−99 dBm)=16 dB, which is greater than the minimum required SNR of 15 dB. Thus a 10-bit DAC yields barely acceptable results while a 9-bit DAC would not.

The switching speed of the DAC, which determines the maximum $f_{LO}$ which can be created because the clock of the DAC must be greater than twice the maximum $f_{LO}$, is determined by the on resistance of transistors 162, 164, 166, and 168 in FIG. 4 and the parasitic capacitances at the sources of the switches. There is a practical speed limit for this structure in a given technology because as the switch resistance is decreased the parasitic capacitance increases. However the practical speed limit is in the range of several GHz for existing integrated circuit technologies, which makes the DDFS/mixer combination suitable for a broad variety of radio frequency receiver applications.

Interface circuit 170 converts the N-bit LO signal into pairs of true and complementary bits so that converter cell 160 can switch the currents differentially. In one embodiment, each of the D and DB signals as well as the current and converter cells are binarily weighted; thus the most significant bit pairs switch currents that are twice the currents switched by the second most significant bit pairs, the second most significant bit pairs switch currents that are twice the currents switched by the third most significant bit pairs, and so on. In this case interface circuit 170 provides 2N output signals consisting of N pairs of D and DB signals.

Preferably to achieve better performance, however, the less significant bits are binarily weighted as just described while the more significant bits are thermometer encoded. In a thermometer encoding scheme, the binary values will be switched using a corresponding number of equally-weighted currents. Thus M thermometer encoded bits switch $2^M-1$ equally-weighted current cells. The number of most significant bits that are thermometer encoded will vary depending on the desired performance, and the number of output pairs generated by interface circuit 170 will also vary accordingly.

The output signal is also preferably a differential signal formed between $I_{OUT+}$ and $I_{OUT-}$. In an alternative embodiment, however, if the drains of transistors 166 and 168 were connected to a reference voltage terminal, such as an analog ground terminal, the drains of transistors 162 and 164 would form a single-ended output signal.

Figure 5:
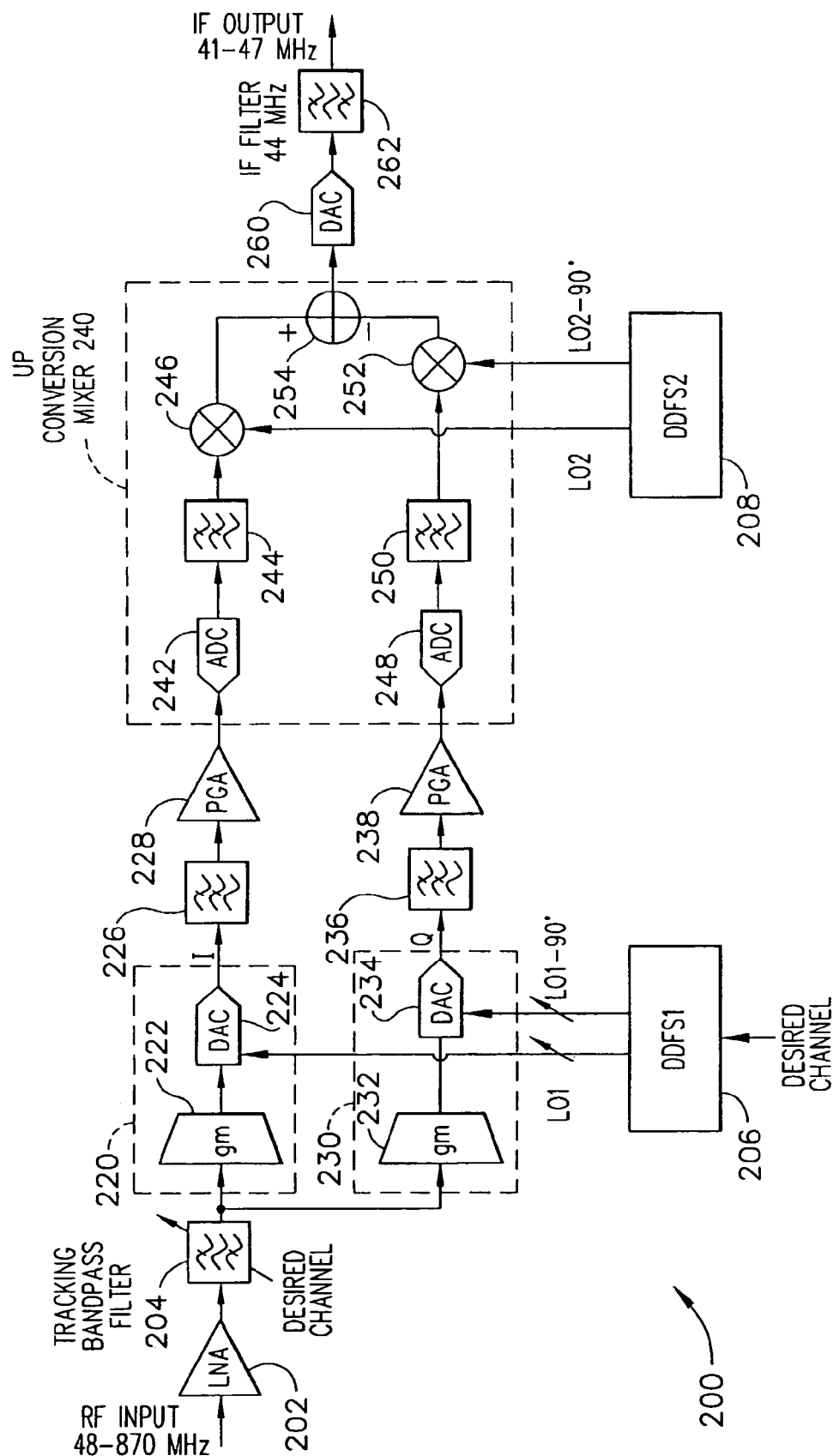
FIG. 5 illustrates in partial block diagram and partial schematic form an integrated television tuner according to the present invention.

FIG. 5 illustrates in partial block diagram and partial schematic form an integrated television tuner 200 according to the present invention. Tuner 200 includes generally an LNA 202, a tracking bandpass filter 204, a DDFS labeled "DDFS1" 206, a DDFS labeled "DDFS2" 208, a mixer 220, a lowpass filter 226, a PGA 228, a mixer 230, a lowpass filter 236, a PGA 238, an up conversion mixer 240, a DAC 260, and an IF filter 262. LNA 202 has an input terminal for receiving the RF INPUT signal, and an output terminal. Tracking bandpass filter 204 has an input terminal connected to the output terminal of LNA 202, a tuning input terminal for receiving the DESIRED CHANNEL signal, and an output terminal. DDFS 206 has an input for receiving the DESIRED CHANNEL signal, and output terminals for providing digital local oscillator signals labeled "LO1" and "LO1-90°". DDFS 208 has output terminals for providing digital local oscillator signals labeled "LO2" and "LO2-90°".

Mixer 220 has a first input terminal connected to the output terminal of tracking bandpass filter 204, a second input terminal for receiving signal LO1, and an output terminal for providing an in-phase baseband signal labeled "I". Mixer 220 includes a transconductance amplifier 222 and a DAC 224. Transconductance amplifier 222 has an input terminal connected to the output terminal of filter 204, and an output terminal. DAC 224 has a first input terminal connected to the output terminal of transconductance amplifier 222, a second input terminal for receiving signal LO1, and an output terminal for providing signal I. Filter 226 has an input terminal connected to the output terminal of mixer 220, and an output terminal. PGA 228 has an input terminal connected to the output terminal of filter 226, and an output terminal.

Mixer 230 has a first input terminal connected to the output terminal of tracking bandpass filter 204, a second input terminal for receiving signal LO1-90°, and an output terminal for providing a quadrature baseband signal labeled "Q". Mixer 230 includes a transconductance amplifier 232 and a DAC 234. Transconductance amplifier 232 has an input terminal connected to the output terminal of filter 204, and an output terminal. DAC 234 has a first input terminal connected to the output terminal of transconductance amplifier 232, a second input terminal for receiving signal LO1-90°, and an output terminal for providing signal Q. Filter 236 has an input terminal connected to the output terminal of mixer 230, and an output terminal. PGA 238 has an input terminal connected to the output terminal of filter 236, and an output terminal.

Up conversion mixer 240 includes an analog-to-digital converter (ADC) 242, a lowpass filter 244, a mixer 246, an ADC 248, a lowpass filter 250, a mixer 252, and a summing device 254. ADC 242 has an input terminal connected to the output terminal of PGA 228, and an output terminal. Lowpass filter 244 has an input terminal connected to the output terminal of ADC 242, and an output terminal. Mixer 246 has a first input terminal connected to the output terminal of lowpass filter 244, a second input terminal for receiving signal LO2, and an output terminal. ADC 248 has an input terminal connected to the output terminal of PGA 238, and an output terminal. Lowpass filter 250 has an input terminal connected to the output terminal of ADC 248, and an output terminal. Mixer 252 has a first input terminal connected to the output terminal of lowpass filter 250, a second input terminal for receiving signal LO2-90°, and an output terminal. Summing device 254 has a positive input terminal connected to the output terminal of mixer 246, a negative input terminal connected to the output terminal of mixer 252, and an output terminal. DAC 260 has an input terminal connected to the output terminal of summing device 254, and an output terminal. IF filter 262 has an input terminal connected to the output terminal of DAC 260, and an output terminal for providing an output signal of tuner 200 labeled "IF OUTPUT".

Figure 1:
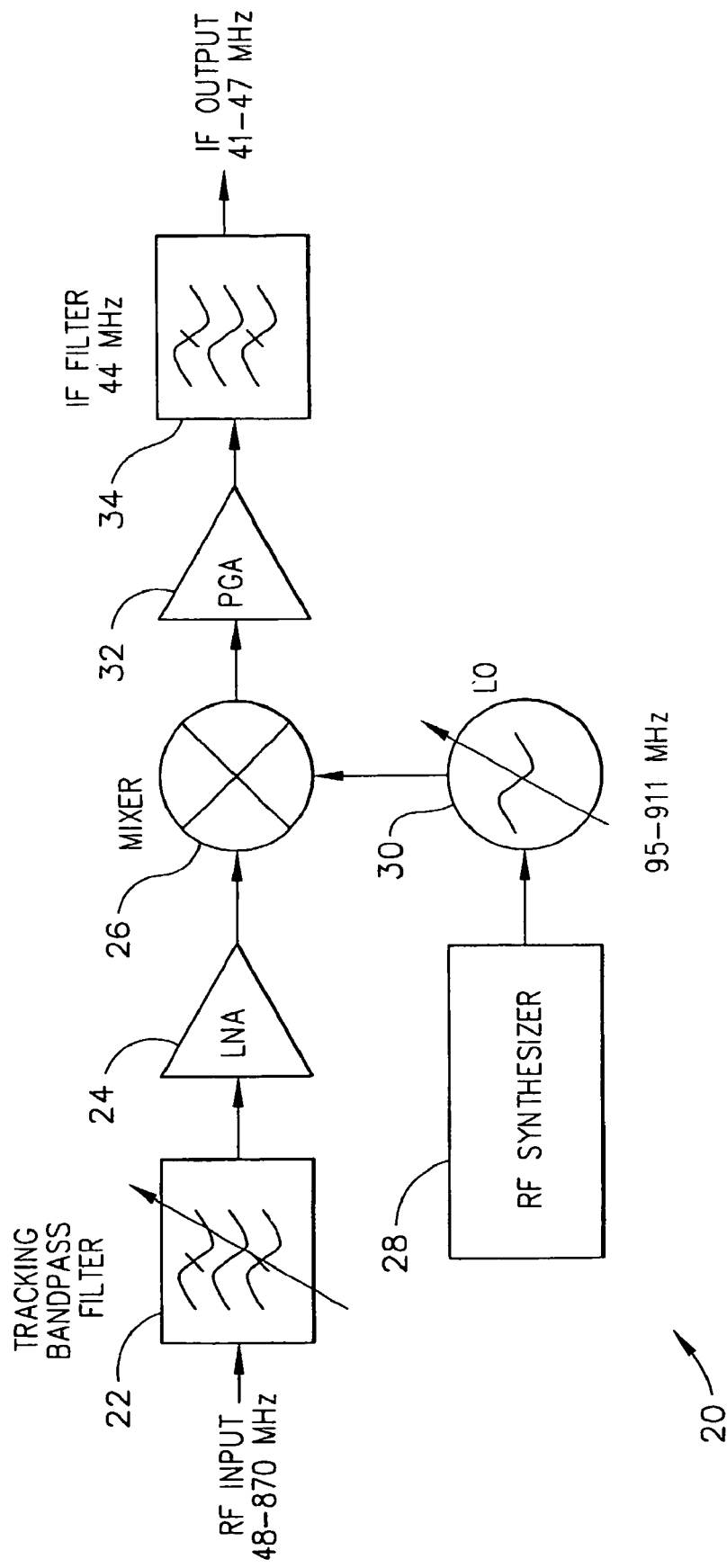
FIG. 1 illustrates in partial block diagram and partial schematic form a discrete television tuner known in the prior art.
Figure 2:
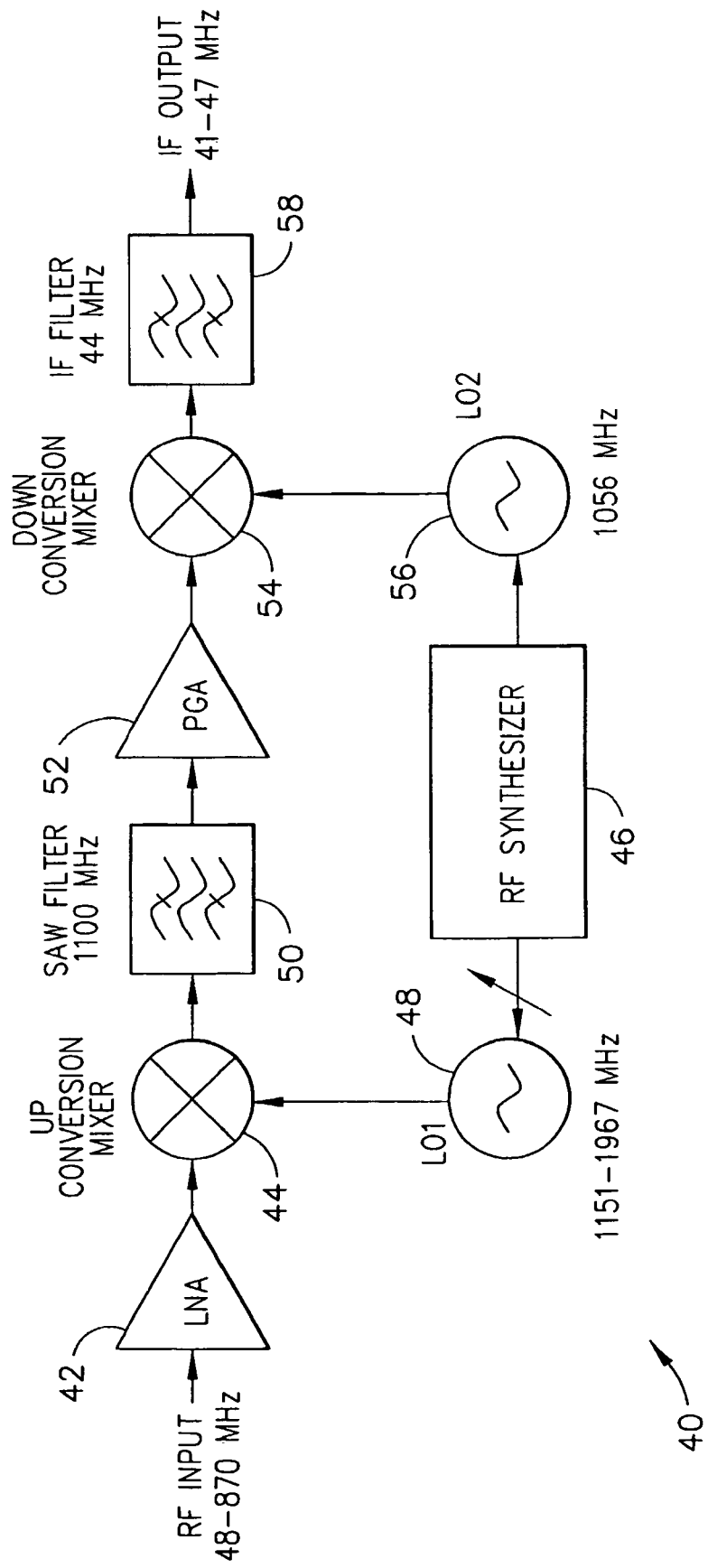
FIG. 2 illustrates in partial block diagram and partial schematic form an integrated television tuner known in the prior art.

In operation tuner 200 solves nearly all of the deficiencies of tuner 40 of FIG. 2 while being keeping the benefits of reduced manufacturing costs and stable performance of an integrated tuner. The RF INPUT signal is received from an antenna or cable source (not shown) and is provided to the input terminal of LNA 202. LNA 202 has a variable gain. The output of LNA 202 is input to tracking bandpass filter 204 whose center frequency is tunable based on the DESIRED CHANNEL input signal to reject undesired channels.

The tuned output signal, which includes the desired channel plus attenuated undesired channels, is mixed to baseband as follows. The output of filter 204 is converted into a current signal by highly linear transconductance amplifier 222. The current signal is then mixed in DAC 224, which functions as a current multiplying DAC using LO1 as a mixing signal, to provide the in-phase baseband signal I. Likewise the output of filter 204 is converted into a current signal by a separate highly linear transconductance amplifier 232, and is mixed in DAC 234 using a phase-shifted version of LO1, namely LO1-90°, as a mixing signal to develop the quadrature baseband signal Q. DDFS 206, transconductance amplifiers 222 and 232, and DACs 224 and 234 are implemented as described above with reference to FIGS. 3 and 4.

Depending on which channel is chosen as the DESIRED CHANNEL, DDFS 206 creates an appropriate sine wave to mix the desired channel down to baseband (i.e. DC). For example if the desired channel is centered at 500 MHz, DDFS 206 creates a 500 MHz sine wave for LO1 as well as a 90° shifted sine wave for LO1-90°. In an alternate embodiment LO1-270° could be used as the phase-shifted version of LO1 in which case the Q signal would be an inverted version of the Q signal as shown. Note that according to Nyquist's theorem DDFS 206 and current multiplying DACs 224 and 234 need to be clocked at greater than twice the highest frequency sine wave. Thus $F_{CLOCK} > 2*870 = 1.740$ GHz and is preferably 2 GHz. The operation of the various circuits at those speeds is possible using currently-available CMOS or bipolar-CMOS (BICMOS) integrated circuit manufacturing technology.

The outputs of mixers 220 and 230 include the desired channel information spectrum and all other energy is filtered by filters 226 and 236. These outputs are then further processed at baseband. Filters 226 and 236 are anti-alias lowpass filters having a cutoff frequency of about 3 MHz. The outputs of filters 226 and 236 are amplified by PGAs 228 and 238 in order to increase the amplitude of small signals and to minimize the dynamic range required of ADCs 242 and 248 in up conversion mixer 240.

In up-conversion mixer 240 the clock rate of ADCs 242 and 248 is preferably below the frequency of any received signal (i.e., 48 MHz) to minimize interference created from the switching that gets reflected back into the analog signal, but is also as high as possible to minimize the order of filters 226 and 236. For use in a television receiver having an IF center frequency of 44 MHz, a clock rate of 40 MHz was chosen. Lowpass filters 244 and 250 provide additional attenuation for undesired channels and are implemented in the digital domain. In an alternative embodiment, up conversion mixer 240 could be implemented in the analog domain and in that case ADCs 242 and 248 would not be necessary. DDFS 208 is preferably clocked at 100 MHz to satisfy the Nyquist criterion for generating a 44 MHz mixing signal.

Even though a baseband digital signal can be used by most televisions available today with simple modifications, tuner 200 preferably provides the analog IF OUTPUT at a standard IF of 44 MHz, although any other desirable IF such as 38 MHz may be used as well. Thus it is necessary for tuner 200 to re-combine the baseband I and Q signals to reconstruct the full 6 MHz spectrum in the IF signal. Up conversion mixer 240 converts the filtered, gain-adjusted I and Q signals into the digital domain using ADCs 242 and 246. Conversion of these signals into the digital domain avoids generating local oscillator signals that can creates spurs or tones, allows a relaxation of the specifications of analog filters 226 and 236, and makes it easier to extract audio signals. Up conversion mixer 240 mixes the outputs of ADCs 242 and 246 (the digital I and Q signals) to IF using digital local oscillator signals LO2 and LO2-90° before combining them in summing device 254. The output of summing device 254 is converted back to analog using IF DAC 260 and filtered in IF filter 262 for driving off-chip. In other embodiments which interface to televisions at baseband, up conversion mixer 240, DAC 260, and IF filter 262 may be omitted.

Tuner 200 overcomes the problems associated with both the discrete LC tuners and integrated up/down converters by not using oscillators to generate LO1 and LO2 and their phase-shifted variants. DDFS 206 provides an ultra pure sine wave with very low phase noise and low spur. The digitized sine wave is widely tunable and is easily generated. Since there is no circuit node that contains an actual oscillator signal, as there would be with LC oscillators, there is no mechanism for the local oscillator signals to leak or radiate into other circuits, causing unwanted locking or spurs. Another advantage of using DACs 224 and 234 is that they allow for direct down conversion to DC in the first mixer. Direct down conversion is not normally possible with an LC oscillator because leakage of the local oscillator signal to the RF INPUT causes a situation where the local oscillator mixes with itself and produces an enormous DC offset with respect to the desired signal. Generation and use of a digital local oscillator signal as required by DACs 224 and 234 eliminate this problem. The first digital local oscillator signal, LO1, mixes the center of the desired channel to DC in the current multiplying DAC by controlling the orientation of the switches. Thus tuner 200 is suitable for integration onto a single silicon chip.

It should be apparent that a tuner using the architecture disclosed herein can be used in a wide variety of RF receiver applications, including television, cellular telephones, pagers, global positioning system (GPS) receivers, cable modems, cordless phones, and the like. The tuner may also use other transistor technologies besides CMOS. Also the type of encoding of the digital oscillator signal used within the DAC, such as binary weighted and thermometer encoded, may vary.

Selectable High-Side/Low-Side Mix for High IF

The DDFS technique can be used in a system that operates at a high IF to improve signal-to-noise ratio (SNR). In general a high IF has a frequency close to the desired frequency spectrum. More particularly, a "high IF" can be defined as an IF that requires a large difference in the range of tuning frequencies between those tuning frequencies used for a low-side mix and those used for a high-side mix for the desired frequency spectrum. In one embodiment, the large difference can be quantified as being greater than about two. As will be described further below, a DDFS can easily produce such a wide range of tuning frequencies and a receiver based on a DDFS can select the mode of operation (high-side mix or low-side mix) based on an interference characteristic that indicates the type of mix that will produce the lowest interference.

The determination of whether a system uses a high IF according to this definition can be understood with reference to concrete examples. In a North American FM radio, the standard IF is equal to 10.7 MHz whereas channels are located in the frequency range of between 88-108 MHz. A low-side mix can be performed by using an LO frequency in the range of between about 99-119 MHz. A high-side mix can be performed using an LO frequency in the range of between about 77 and 97 MHz. The range of frequencies for the low-side mix is about 1.20. The range of frequencies for the high-side mix is about 1.26. The ratio of 1.26/1.20 is equal to 1.05 which is less than 2. Therefore, an IF of 10.7 MHz is not a high IF relative to the 88-108 MHz RF band.

To take another example, assume the RF band of interest is between 11-31 MHz, and the IF is 10 MHz. A high-side mix requires tuning frequencies in the range of about 21-41 MHz, whereas a low-side mix requires tuning frequencies in the range of about 1-21 MHz. The range for the high-side mix is about 2, whereas the range for the low-side mix is about 20. The ratio of 20/2 is greater than 2, and therefore an IF of 10 MHz is a high IF relative to the 11-31 MHz band.

Figure 6:
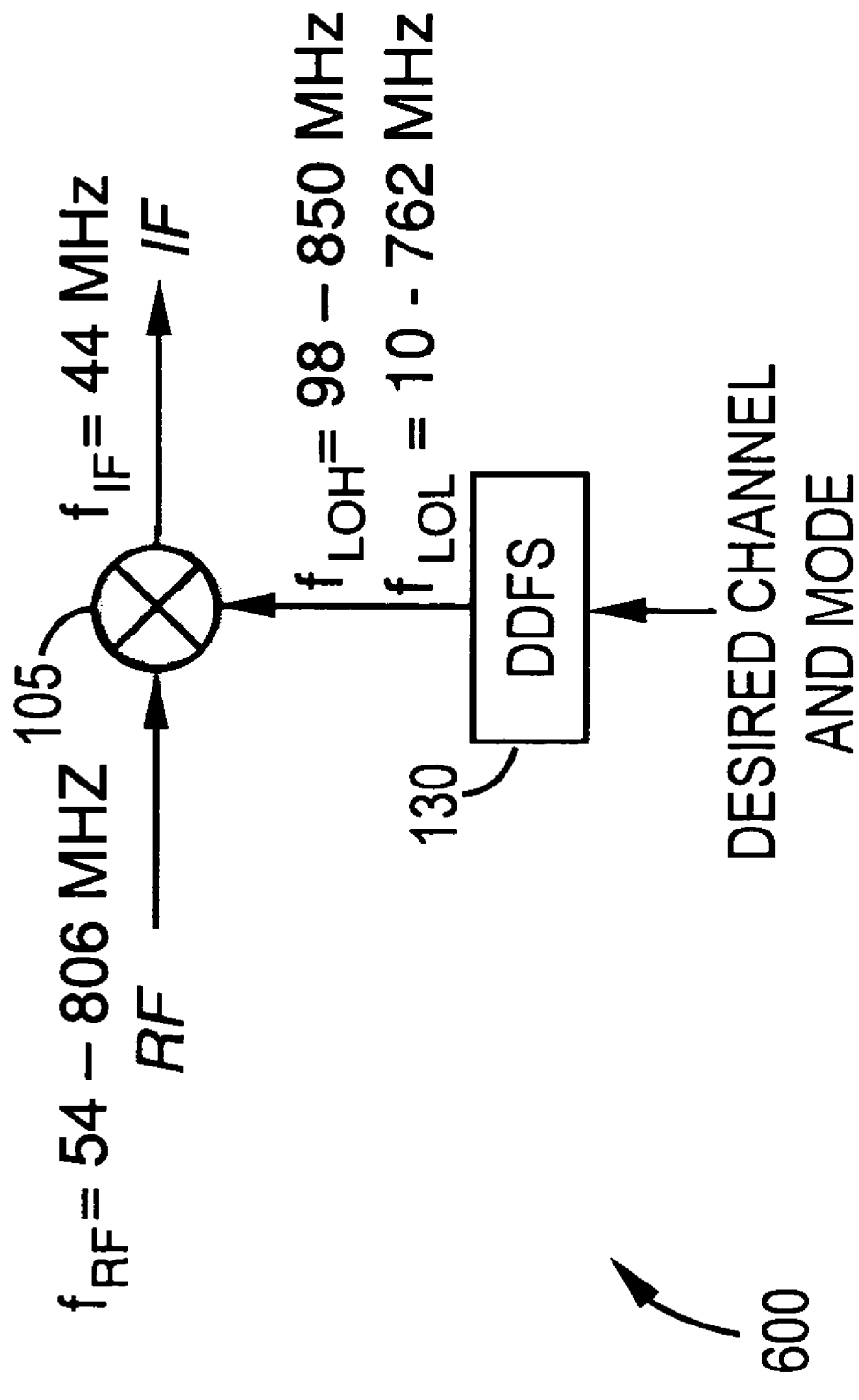
FIG. 6 illustrates the local oscillator and mixer circuit of FIG. 3 with frequency ranges used to perform high-side and low-side mixes.

Another example is shown in FIG. 6, which illustrates a local oscillator and mixer circuit 600 using DDFS 130 and mixer circuit 105 of FIG. 3 with frequency ranges used to perform high-side and low-side mixes. DDFS 130 has an input terminal for receiving a signal labeled "DESIRED CHANNEL AND MODE", and an output terminal for providing a local oscillator signal. Mixer 105 has a first input terminal for receiving a signal labeled "RF", a second input terminal connected to the output terminal of DDFS 130, and an output terminal for providing a signal labeled "IF". Thus the structure is the same as for elements 130 and 105 of FIG. 3, except that DDFS 130 receives a DESIRED CHANNEL AND MODE signal that now indicates, either directly or indirectly, both the desired channel and the selected mixing mode. The selected mixing mode indicates whether local oscillator and mixer circuit 600 performs a high-side mix or a low-side mix.

The example shown in FIG. 6 is North American broadcast television using a standard IF of 44 MHz with an RF band of interest between 54 and 806 MHz. When DESIRED CHANNEL AND MODE indicates a high-side mix, DDFS 130 outputs a local oscillator signal labeled "$f_{LOH}$" of between 98 and 850 MHz depending on the desired channel. When DESIRED CHANNEL AND MODE indicates a low-side mix, DDFS 130 outputs a local oscillator signal labeled "$f_{LOL}$" of between 10 and 762 MHz depending on the desired channel.

With regard to this desired frequency spectrum, an IF of 44 MHz meets the requirements of a high IF. The range of frequencies for a low-side mix is 762/10, or about 76.2. The range of frequencies for a high-side mix is 850/98, or about 8.7. The ratio of 76.2 to 8.7 is equal to about 8.8, which is greater than 2, and therefore the IF of 44 MHz is a high IF relative to the 54-806 MHz band.

Terrestrial television often involves reception of relatively weak signals from distant transmitters in the presence of relatively strong signals from nearby transmitters, in which the relatively strong signals may include image frequencies that mix into the passband and cause interference with the desired channel. However since a DDFS tuner can easily generate a complex, image reject mix and tracking filters are not required. Also since a DDFS can accurately provide a very wide range of tuning frequencies, a DDFS-based receiver can easily change the mixing mode based on the interference characteristic of the particular channel being tuned. Thus, the mixing mode that provides the best characteristics can be selected for each channel based on its interference characteristic.

Figure 7:
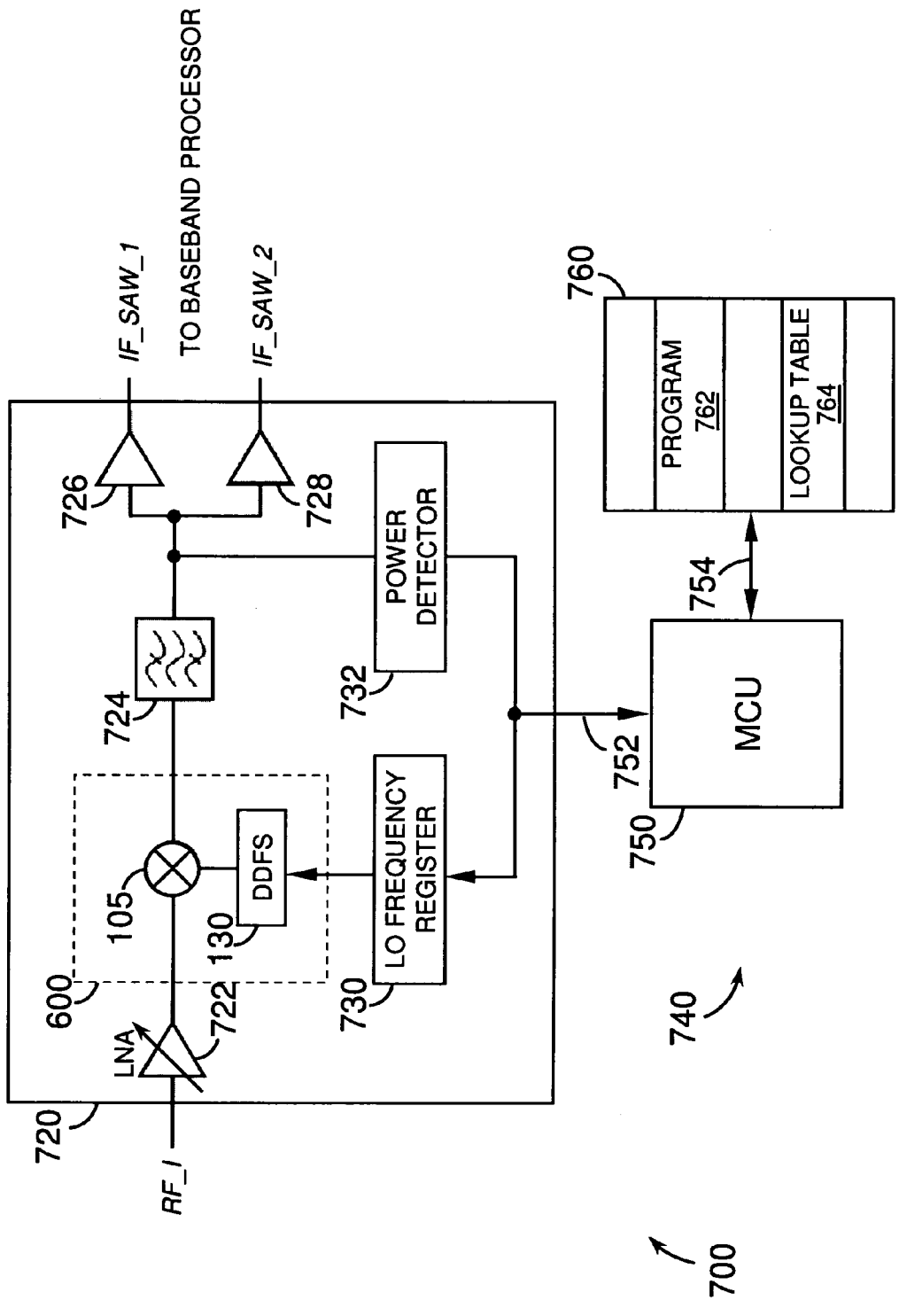
FIG. 7 illustrates a television receiver according to another aspect of the present invention.

This technique can now be illustrated in the context of a complete receiver. FIG. 7 illustrates a television receiver 700 according to another aspect of the present invention. Receiver 700 includes generally an integrated circuit receiver 720 and a logic circuit 740. Receiver IC 720 includes a low-noise amplifier (LNA) 722, local oscillator and mixer circuit 600, a bandpass filter 724, buffers 726 and 728, an LO frequency register 730, and a power detector 732. LNA 722 as an input terminal for receiving an RF input signal labeled "RF_I", a control input terminal for receiving a gain signal, and an output terminal. Local oscillator and mixer circuit 600 has a signal input terminal connected to the output terminal of LNA 722, a control input terminal, and an output terminal. Bandpass filter 724 has an input terminal connected to the output terminal of local oscillator and mixer circuit 600, and an output terminal. Buffer 726 has an input terminal connected to the output terminal of bandpass filter 724, and an output terminal for providing a signal labeled "IF_SAW_1". Buffer 728 has an input terminal connected to the output terminal of bandpass filter 724, and an output terminal for providing a signal labeled "IF_SAW_2". IF_SAW_1 and IF_SAW_2 are outputs available for separate demodulators, not shown in FIG. 7. LO frequency register 730 has an input terminal connected to an interchip bus 752, and an output terminal connected to the control input terminal of mixer 600. Power detector 732 has an input terminal connected to the output terminal of bandpass filter 724, and an output terminal connected to interchip bus 752.

Logic circuit 740 includes a data processor in the form of a microcontroller (MCU) 750 and a memory 760. MCU 750 is connected to interchip bus 752 and to a memory bus 754. Memory 760 is connected to memory bus 754 and has a first area 762 for storing a program and a second area 764 for storing a lookup table.

In operation, receiver IC 720 operates as part of a high IF receiver system capable of receiving a North American broadcast television signal. LNA 722 adjusts the signal level of RF_I based on a voltage applied to its control input terminal. This voltage is determined by automatic gain control (AGC) implemented in circuitry not shown in FIG. 7. LO frequency register 730 receives a value over interchip bus 752 from MCU 750 and provides this value to directly control the frequency of DDFS 730. Thus in receiver system 700, LO frequency register 730 indirectly indicates the mixing mode (high-side mix or low-side mix) through the selection of the frequency value to DDFS 130. In an alternate embodiment, a register similar to LO frequency register 730 could separately store a mixing mode value and a channel frequency value.

DDFS 130 has the characteristic that the waveform of the LO signal is defined digitally while the DDFS uses a single frequency clock signal. The highest output frequency of the DDFS is set by the Nyquist theorem to be no more than one-half of the DDFS clock and therefore DDFS 130 must be clocked at least twice the highest frequency required for high side mixing. For the North American terrestrial television example, this frequency is 2×850 MHz. The lowest output frequency can be made arbitrarily low and thus DDFS 130 is suitable for low-side mixing in high IF systems.

As opposed to receiver 200 of FIG. 5, receiver IC 720 is a single conversion receiver that uses a single mixing stage to convert the desired channel from RF to the selected IF of 44 MHz. Note that receiver IC 720 uses other techniques such as differential signaling and quadrature mixing for image rejection that are not specifically shown in FIG. 7.

Logic circuit 740 in conjunction with LO frequency register 730 on receiver IC 720 functions as a determination circuit to cause DDFS 130 to output the digital LO signal at a frequency suitable for performing either a high-side mix or a low-side mix in response to both the desired channel and an interference characteristic of the desired channel. In the illustrated embodiment, logic circuit 740 includes MCU 750 and memory 760 but other types of logic circuits may be used, and one or more components of such logic circuits may be combined with the elements of receiver IC 720 on the same integrated circuit.

MCU 750 performs the determination of the best mixing mode based on the interference characteristic of the desired channel under the control of program 762. According to one aspect of receiver 700, program 762 causes MCU 750, at startup, to determine whether to perform a high-side mix or a low-side mix of all possible channels. MCU 750 then stores the determinations in lookup table 764. Later when the user changes the channel to another channel, MCU 750 retrieves the determination for that channel from lookup table 764 and uses it to program LO frequency register 730.

Receiver 700 advantageously makes the determination by using circuitry available on receiver IC 720, namely power detector 732. At startup, MCU 750 programs LO frequency register 730 to mix (using either a low-side mix or a high-side mix) all channels, one at a time. Once MCU 750 has programmed LO frequency register 730 for a particular channel, it determines the power of the received signal using power detector 732. MCU 750 then determines for each channel the power of any interfering channel, i.e. any channel that has an image frequency that would be mixed into the desired channel's passband, and selects the high-side mix mode or the low-side mix mode depending on which mode produces the lower power from any interfering channel.

Alternatively receiver IC 700 could incorporate a block, similar to power detector 732, that measures SNR and makes the measured SNR available to logic circuit 74 over interchip bus 752. Then receiver 700 could determine, on a per-channel basis, whether high-side or low-side mixing provides a higher SNR. These determinations could be performed at startup or during operation when the user changes the channel.

It should be apparent that the use of selectable high-side and low-side mixing can be implemented on other high IF systems besides North American terrestrial television. Some or all of the circuitry used in the determination of whether to perform a high-side mix or a low-side mix could be combined with the mixer itself on a single IC. Moreover other logic circuits not based on a data processor are possible.

While an exemplary embodiment(s) has been presented in the foregoing detailed description of the invention, it should be appreciated that a vast number of variations exist. It should also be appreciated that these exemplary embodiments are only examples, and are not intended to limit the scope, applicability, or configuration of the invention in any way. Rather, the foregoing detailed description will provide those skilled in the art with a convenient road map for implementing a preferred embodiment of the invention. It being understood that various changes may be made in the function and arrangement of elements described in an exemplary preferred embodiment without departing from the spirit and scope of the invention as set forth in the appended claims.

What is claimed is:

1. A method comprising the steps of:
   selecting one of a high-side mix mode and a low-side mix mode in response to an interference characteristic of a desired channel of a radio frequency (RF) input signal;
   in said high-side mix mode, initializing a direct digital frequency synthesizer to output a digital local oscillator signal at a first frequency suitable for performing a high-side mix of said desired channel to an intermediate frequency (IF), wherein said digital local oscillator signal is a multiple-bit digital representation of voltages of a sine wave;
   in said low-side mix mode, initializing said direct digital frequency synthesizer to output said digital local oscillator signal at a second frequency suitable for performing a low-side mix of said desired channel to said IF; and
   mixing said RF input signal with said digital local oscillator signal to provide an IF output signal at said IF.

2. The method of claim 1, wherein said step of mixing further comprises the step of mixing said RF signal with said digital local oscillator signal to provide said IF output signal at a high IF.

3. The method of claim 1 wherein said step of selecting further comprises the steps of:
   estimating a first signal-to-noise ratio (SNR) of said IF output signal when said direct digital frequency synthesizer is operated in said high-side mix mode;
   estimating a second SNR of said IF output signal when said direct digital frequency synthesizer is operated in said low-side mix mode; and
   determining which one of said high-side mix mode and said low-side mix mode has a lower corresponding SNR for said desired channel.

4. The method of claim 3, wherein said step of selecting further comprising the steps of:
   repeating said steps of estimating said first SNR, estimating said second SNR, and determining for each of a plurality of channels in response to a power-on event; and
   storing determinations for each of said plurality of channels in a lookup table.

5. The method of claim 3, further comprising the steps of:
   retrieving a determination of whether to perform said high-side mix or said low-side mix of a new channel in response to a channel change; and
   initializing said direct digital frequency synthesizer to output said digital local oscillator signal at a new frequency determined by both said new channel and said determination; and
   mixing said RF input signal with said digital local oscillator signal at said new frequency to provide said IF output signal at said IF.

6. The method of claim 3, further comprising the step of performing said steps of estimating said first SNR, estimating said second SNR, and determining in response to a channel change to a new channel.

7. The method of claim 6, further comprising the steps of:
   initializing said direct digital frequency synthesizer to output said digital local oscillator signal at a new frequency determined by both said new channel and a determination of whether to perform said high-side mix or said low-side mix of said new channel; and
   mixing said RF input signal with said digital local oscillator signal at said new frequency to provide said IF output signal at said IF.

8. The method of claim 1, wherein said step of selecting comprises the steps of:
- measuring a power of said IF output signal for each of a plurality of channels in a spectrum; and
- determining whether a power of first one of said plurality of channels that interferes with said desired channel when performing said high-side mix is greater than a power of a second one of said plurality of channels that interferes with said desired channel when performing said low-side mix.

9. A receiver comprising:
- a direct digital frequency synthesizer having an output for providing a digital local oscillator signal at a frequency that mixes a desired channel to a high intermediate frequency (IF), wherein said digital local oscillator signal is a multiple-bit digital representation of voltages of a sine wave;
- a mixer having a first input for receiving a radio frequency (RF) input signal, a second input coupled to said output of said direct digital frequency synthesizer, and an output for providing an IF output signal at said high IF; and
- a determination circuit having an output coupled to said direct digital frequency synthesizer for causing said direct digital frequency synthesizer to output said digital local oscillator signal at a frequency suitable for performing a selected one of a high-side mix and a low-side mix in response to both said desired channel and an interference characteristic of said desired channel.

10. The receiver of claim 9, wherein said determination circuit comprises:
- a register for storing a local oscillator frequency value and having an output coupled to an input of said direct digital frequency synthesizer.

11. The receiver of claim 10, wherein said determination circuit further comprises:
- a power detector having an input coupled to said output of said mixer, and an output; and
- a logic circuit coupled to said output of said power detector, and having an output for providing said local oscillator frequency value determined by both said desired channel and a determination of whether to perform a high-side mix or a low-side mix based on a smaller output of said power detector.

12. The receiver of claim 11, wherein said logic circuit comprises:
- a data processor having an input coupled to said output of said power detector; and
- a memory coupled to said data processor for storing a program that controls said data processor to determine said local oscillator frequency value.

13. The receiver of claim 12, wherein said memory further stores a lookup table and wherein said data processor, in response to said program, determines whether to perform said high-side mix or said low-side mix for each of a plurality of channels and stores a corresponding determination in said lookup table.

14. An integrated circuit tuner comprising:
- a direct digital frequency synthesizer having an input for receiving a local oscillator frequency value, and an output for providing a digital local oscillator signal at a frequency corresponding to said local oscillator frequency value;
- a mixer having a first input for receiving a radio frequency (RF) input signal, a second input coupled to said output of said direct digital frequency synthesizer, and an output for providing an intermediate frequency (IF) output signal at a high IF;
- a power detector having an input coupled to said output of said mixer, and an output adapted to be coupled to a logic circuit; and
- a local oscillator frequency register having an input adapted to be coupled to said logic circuit, and an output coupled said input of said direct digital frequency synthesizer for receiving and storing said local oscillator frequency value from said logic circuit, said logic circuit using said output of said power detector to provide said local oscillator frequency value to cause said mixer to mix a desired channel of said RF input signal to a high IF using a selected one of a high-side mix and a low-side mix.

15. The integrated circuit tuner of claim 13, wherein said logic circuit is characterized as being external to said integrated circuit tuner and said power detector is adapted to be coupled to said external logic circuit over an interchip bus.

16. The integrated circuit tuner of claim 14, wherein said interchip bus comprises a bidirectional data signal line and a clock line.

17. The integrated circuit tuner of claim 14, wherein said logic circuit is an internal logic circuit.

18. The integrated circuit tuner of claim 14, wherein the logic circuit comprises:
- a data processor having an input coupled to said output of said power detector; and
- a memory coupled to said data processor for storing a program that controls said data processor to determine said local oscillator frequency value.

19. The integrated circuit tuner of claim 18, wherein the program further controls said data processor to determine a local oscillator frequency value for a plurality of channels.

20. The integrated circuit tuner of claim 19, wherein said program further controls said data processor to store said local oscillator frequency values for said plurality of channels in a lookup table of said memory.

* * * * *